US010599045B2

(12) United States Patent
Mizuta et al.

(10) Patent No.: US 10,599,045 B2
(45) Date of Patent: Mar. 24, 2020

(54) EXPOSURE METHOD, EXPOSURE SYSTEM, AND MANUFACTURING METHOD FOR SEMICONDUCTOR DEVICE (71) Applicant: Toshiba Memory Corporation, Minato-ku (JP)

(72) Inventors: Yoshio Mizuta, Yokkaichi (JP); Nobuhiro Komine, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 66 days.

(21) Appl. No.: 15/903,274

(22) Filed: Feb. 23, 2018

(65) Prior Publication Data
US 2019/0079412 A1 Mar. 14, 2019

(30) Foreign Application Priority Data

Sep. 12, 2017 (JP) .................................. 2017-174492

(51) Int. Cl.
*G03F 7/20* (2006.01)
*H01L 21/02* (2006.01)
*H01L 21/66* (2006.01)
*H01L 21/027* (2006.01)
*G03F 9/00* (2006.01)

(52) U.S. Cl.
CPC .......... *G03F 7/70308* (2013.01); *G03F 7/706* (2013.01); *G03F 7/70241* (2013.01); *G03F 7/70258* (2013.01); *G03F 7/70641* (2013.01); *G03F 9/7026* (2013.01); *H01L 21/0274* (2013.01); *H01L 22/24* (2013.01); *H01L 22/12* (2013.01); *H01L 22/20* (2013.01)

(58) Field of Classification Search
CPC .................................................. G03F 7/70308
See application file for complete search history.

(56) References Cited

U.S. PATENT DOCUMENTS

| 5,432,587 | A | 7/1995 | Nozue |
| 9,557,523 | B2 | 1/2017 | Suda |
| 2009/0190108 | A1 | 7/2009 | Ema et al. |
| 2015/0338745 | A1* | 11/2015 | Fukazawa ........... G03F 7/70625 355/77 |

FOREIGN PATENT DOCUMENTS

| JP | 06-275490 | 9/1994 |
| JP | 2993419 | 12/1999 |
| JP | 2009-182323 | 8/2009 |
| JP | 2014-236163 | 12/2014 |

* cited by examiner

*Primary Examiner* — Mounir S Amer
(74) *Attorney, Agent, or Firm* — Oblon, McClelland, Maier & Neustadt, L.L.P.

(57) ABSTRACT

According to an embodiment, focus sensitivity information in which focus sensitivity expressing a relation between an aberration correction value set in an exposure device and a best focus when a pattern is formed on a first substrate by exposure of the exposure device using the aberration correction value, and the pattern are correlated is input. Moreover, on the basis of the focus sensitivity information and a surface height difference of a second substrate, the aberration correction value in which best focuses for a pattern group to be formed on the second substrate by exposure satisfy a first condition is calculated. In addition, the second substrate is exposed by the exposure device using the aberration correction value satisfying the first condition.

8 Claims, 6 Drawing Sheets

EXPOSURE METHOD, EXPOSURE SYSTEM, AND MANUFACTURING METHOD FOR SEMICONDUCTOR DEVICE

CROSS-REFERENCE TO RELATED APPLICATIONS

This application is based upon and claims the benefit of priority from Japanese Patent Application No. 2017-174492, filed on Sep. 12, 2017; the entire contents of which are incorporated herein by reference.

FIELD

Embodiments described herein relate generally to an exposure method, an exposure system, and a manufacturing method for a semiconductor device.

BACKGROUND

A substrate where a semiconductor device is formed may include a locally high region and a locally low region on the substrate. Exposing the substrate with such a height difference causes a difference in best focus between the regions with the different heights. In such a case, the defocus due to the height difference between patterns can be reduced by setting the focus that is appropriate in accordance with the height difference.

In a case where the regions have a constant height difference and patterns with different densities between these regions are disposed, exposure is performed after the spherical aberration is adjusted, so that the difference in best focus between the regions can be reduced.

However, if the height between the patterns varies for each of substrates with various pattern densities, the optimum value of the spherical aberration for reducing the difference in best focus between the patterns varies. In this case, the amount of defocus of each pattern increases because of the height difference between the patterns.

DETAILED DESCRIPTION

According to the present invention, an exposure method is provided. In the exposure method, focus sensitivity information in which focus sensitivity expressing a relation between an aberration correction value set in an exposure device and a best focus when a pattern is formed on a first substrate by exposure of the exposure device using the aberration correction value, and the pattern are correlated is input. Moreover, in the exposure method, a surface height difference of a second substrate is measured, and on the basis of the focus sensitivity information and the surface height difference, the aberration correction value in which best focuses for a pattern group to be formed on the second substrate by exposure satisfy a first condition is calculated. In addition, in the exposure method, the second substrate is exposed by the exposure device using the aberration correction value satisfying the first condition.

Exemplary embodiments of an exposure method, an exposure system, and a manufacturing method for a semiconductor device will be explained below in detail with reference to the accompanying drawings. The present invention is not limited to the following embodiments.

First Embodiment

Embodiment

Figure 1:
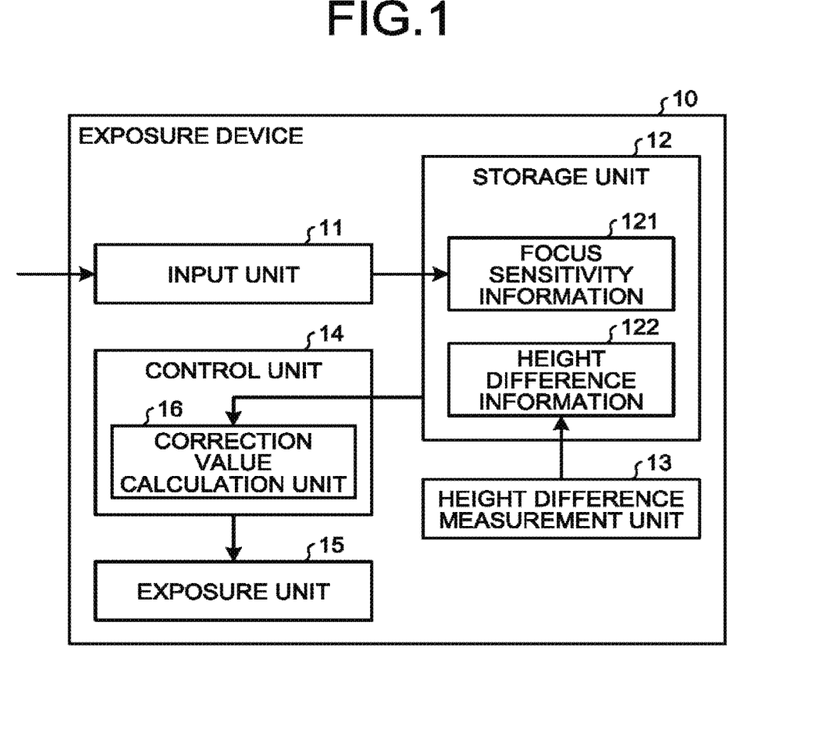
FIG. 1 is a block diagram illustrating a structure of an exposure device according to an embodiment.

FIG. 1 is a block diagram illustrating a structure of an exposure device according to the embodiment. An exposure device (exposure system) 10 is a device that irradiates a substrate such as a semiconductor circuit substrate with exposure light. The exposure device 10 includes an input unit 11, a storage unit 12, a height difference measurement unit 13, a control unit 14, and an exposure unit 15.

The input unit 11 receives focus sensitivity information 121, which will be described below, from an external device and inputs the focus sensitivity information 121 to the storage unit 12. The focus sensitivity information 121 is the information on the focus sensitivity expressing the relation between the best focus when the substrate is exposed and an aberration correction value.

Correspondence

The substrate has various heights depending on regions, and there is a difference in height (height difference) between regions. In other words, the substrate has a height difference (surface height difference) between the regions. Thus, since the substrate has various heights depending on the regions, the patterns in the substrate have the height difference. That is to say, in the substrate, the height of the pattern differs for every coordinate in the pattern. Note that the height of the pattern in the embodiment is not the height of the pattern itself but the height depending on the height difference on the surface of the substrate. In other words, the height of the pattern in the embodiment is the height of the position where the pattern is formed (bottom of pattern). The height of the pattern itself is substantially the same over the entire surface of the substrate.

The aberration is a deviation from an ideal focusing position of an optical system in the exposure device 10, and the aberration correction value is a correction value for correcting the aberration. Examples of the aberration include spherical aberration, astigmatism, and coma aberration. In the description of the embodiment, the aberration is spherical aberration. Therefore, the aberration correction value to be described below is a spherical aberration correction value.

The regions in the substrate have various pattern densities. In this manner, the regions in the substrate have various pattern densities and various heights. As a result, on the substrate, the best focus varies depending on the patterns on the substrate, and the focus sensitivity is different for each pattern.

Therefore, in the focus sensitivity information (correlation information) 121 of this embodiment, the pattern in the substrate (such as the coordinate) and the focus sensitivity are correlated with each other. In other words, the focus sensitivity information 121 has the focus sensitivity for each pattern. The focus sensitivity is the amount of variation of the best focus relative to the amount of variation of the aberration correction value. Specifically, the focus sensitivity represents the relation between the aberration correction value set in the exposure device 10 and the best focus when the pattern is formed on the substrate by the exposure of the exposure device 10 with the use of this aberration correction value. In other words, the focus sensitivity corresponds to an inclination (coefficient) when the aberration correction value is expressed along a horizontal axis and the best focus is expressed along a vertical axis. In the focus sensitivity information 121, for example, a first height (first best focus) and a first aberration correction value are correlated with respect to a first pattern. Each pattern is identified by, for example, a coordinate where the pattern is disposed.

In the present embodiment, the focus sensitivity information 121 is the information in the substrate; however, the focus sensitivity information 121 may be the information in the shot. That is to say, the focus sensitivity information 121 may be the correlation between the height in the substrate and the aberration correction value, or the correlation between the height in the shot and the aberration correction value.

The height difference measurement unit 13 includes a focus sensor that measures the height of each region in the substrate (height difference in the substrate). The height difference measurement unit 13 transmits height difference information 122 corresponding to a measurement result to the storage unit 12. The height difference information 122 is the information in which the coordinate in the substrate and the height are correlated with each other. The storage unit 12 stores the focus sensitivity information 121 transmitted from the external device, and the height difference information 122 transmitted from the height difference measurement unit 13.

The control unit 14 controls the exposure unit 15. The control unit 14 includes a correction value calculation unit 16 that calculates, for each substrate, the aberration correction value that is appropriate to the substrate. The correction value calculation unit 16 reads out the focus sensitivity information 121 and the height difference information 122 from the storage unit 12, and moreover calculates the appropriate aberration correction value on the basis of the read focus sensitivity information 121 and height difference information 122.

Specifically, the correction value calculation unit 16 extracts the correlation (focus sensitivity) between the aberration correction value and the best focus included in each pattern on the substrate from the focus sensitivity information 121. In addition, the correction value calculation unit 16 extracts the height included in each pattern on the substrate from the height difference information 122. Then, the correction value calculation unit 16 calculates the aberration correction value at which the difference in best focus between the patterns is the minimum, on the basis of the relation between the focus sensitivity and the height in each pattern. Note that the correction value calculation unit 16 may calculate the aberration correction value at which the standard deviation of the best focus is the minimum.

The control unit 14 controls the exposure unit 15 that emits exposure light by using the aberration correction value calculated by the correction value calculation unit 16. The exposure unit 15 exposes the substrate after correcting the aberration in accordance with an instruction from the control unit 14. Specifically, the exposure unit 15 exposes the substrate after correcting the aberration by using the aberration correction value transmitted from the control unit 14.

In the present embodiment, before the substrate to become a product (hereinafter referred to as a product substrate) is exposed, the focus sensitivity information 121 is formed using a sample substrate. The sample substrate is a substrate provided with a pattern similar to a pattern of the product substrate. In other words, on the sample substrate, films similar to films of the product substrate are stacked. Note that a plurality of sample substrates may be used.

When the focus sensitivity information 121 is formed, a resist is applied on the sample substrate and the sample substrate is exposed by the exposure device 10 with various aberration correction values and various focus values. The exposure device to expose the sample substrate may be other exposure device than the exposure device 10. A photomask used to expose the sample substrate is a photomask provided with the same mask pattern as a mask pattern of a photomask used when the pattern is formed on the product substrate. Therefore, it is unnecessary that the photomask used to expose the sample substrate is the same as the photomask used to expose the product substrate. The photomask used to expose the sample substrate may be a different photomask in which the same mask pattern is formed.

The sample substrate is exposed and then developed, and a resist pattern is formed on the sample substrate. This forms the same resist pattern as that in the processing of the product on the sample substrate under various conditions. The resist pattern formed on the sample substrate is a sample pattern.

After that, the dimension of the sample pattern (such as the pattern width) is measured by a measurement device such as a critical dimension-scanning electron microscope (CD-SEM). Then, based on the correlation among the aberration correction value, the focus value, and the dimension of the sample pattern, the focus sensitivity information 121 is formed.

The dimension of the sample pattern is different for each focus value. Among the focus values, the focus value at which the dimension of the sample pattern is the maximum or the minimum corresponds to the best focus value. For example, if the sample pattern is a space pattern, the focus value at which the dimension of the sample pattern is the maximum corresponds to the best focus value. If the sample pattern is a line pattern, the focus value at which the dimension of the sample pattern is the minimum corresponds to the best focus value. In the description below, the sample pattern is the space pattern.

The best focus value is the value different for each aberration correction value. The correlation between the aberration correction value and the best focus value corresponds to the focus sensitivity. When the focus sensitivity information 121 is formed, this focus sensitivity is correlated with the pattern.

Figure 2:
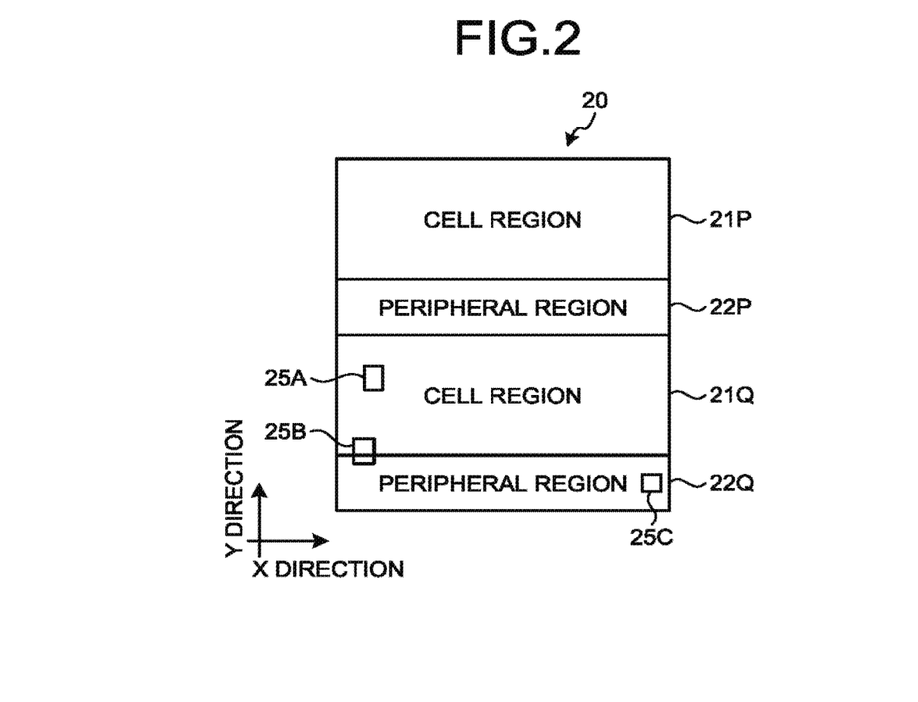
FIG. 2 is a diagram for describing a structure in a shot.

Here, description is made of a structure in the shot, the pattern density in the shot, and the height difference in the shot. FIG. 2 is a diagram for describing a structure in the shot. FIG. 2 is a top view of a shot 20. FIG. 2 illustrates a structure example of an exposure shot disposed in the sample substrate and the product substrate. In the sample substrate and the product substrate such as a wafer, a plurality of shots 20 is disposed and the shot 20 is the unit of performing the exposure.

The shot 20 includes a plurality of regions such as a cell region and a peripheral region. In FIG. 2, the shot 20 includes cell regions 21P and 21Q, and peripheral regions 22P and 22Q. The cell regions 21P and 21Q are regions where memory cells are disposed, and the peripheral regions 22P and 22Q are element separation regions (isolation regions) to separate the cell regions 21P and 21Q. The peripheral regions 22P and 22Q are disposed around the cell regions 21P and 21Q. In the cell regions 21P and 21Q, small cell patterns (first patterns) are disposed and in the peripheral regions 22P and 22Q, isolation patterns (second patterns) larger than the cell patterns are disposed.

Therefore, the shot 20 has various pattern densities depending on the regions. The pattern density is the density of patterns disposed in the region. For example, a cell part 25A at a center of the cell region 21Q has a first pattern density. In addition, a border part 25B at a border between the cell region 21Q and a peripheral part 25C has a second pattern density and the peripheral part 25C at a center of the peripheral region 22Q has a third pattern density.

Figure 3:
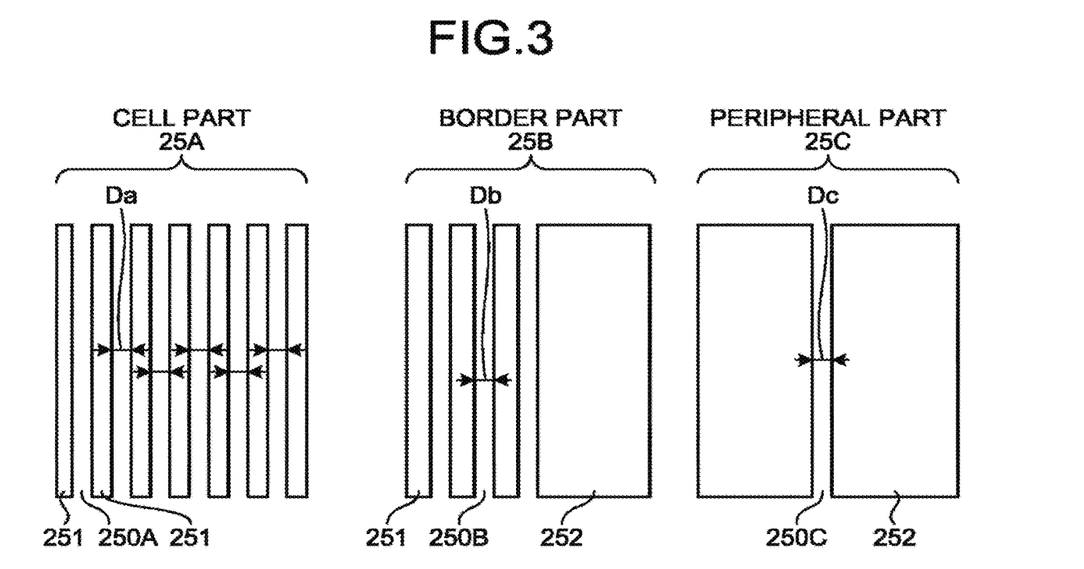
FIG. 3 is a diagram for describing the pattern density in the shot.

FIG. 3 is a diagram for describing the pattern density in the shot. FIG. 3 is a top view of the cell part 25A, the border part 25B, and the peripheral part 25C. In the cell part 25A, a space pattern 250A with a dimension width Da is disposed; in the border part 25B, a space pattern 250B with a dimension width Db is disposed; and in the peripheral part 25C, a space pattern 250C with a dimension width Dc is disposed. The space pattern 250A is a pattern of a gap between a line pattern 251 and another line pattern 251, the space pattern 250B is a pattern of a gap between the line pattern 251 and a line pattern 252, and the space pattern 250C is a pattern of a gap between the line pattern 252 and another line pattern 252. In the present embodiment, for the convenience of description, the dimension widths Da to Dc are the same.

In the cell part 25A, the line patterns 251 with the small dimension are disposed. In addition, in the border part 25B, the line patterns 251 with the small dimension and the line pattern 252 with the large dimension are disposed. Furthermore, in the peripheral part 25C, the line patterns 252 with the large dimension are disposed. Therefore, the pattern density of the line patterns is smaller in the cell part 25A than in the border part 25B, and the pattern density of the line patterns is smaller in the border part 25B than in the peripheral part 25C. In other words, the density of the space pattern per unit area is larger in the cell part 25A than in the border part 25B, and the density of the space pattern per unit area is smaller in the border part 25B than in the peripheral part 25C.

Figure 4:
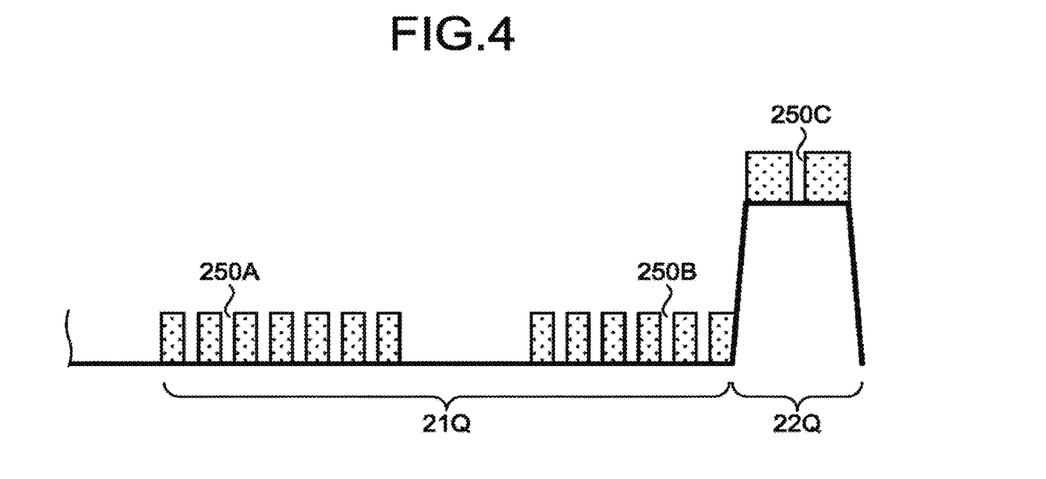
FIG. 4 is a diagram for describing the height difference in the shot.

FIG. 4 is a diagram for describing the height difference in the shot. FIG. 4 is a cross-sectional view of the cell region 21Q and the peripheral region 22Q. Between a lower layer side in the cell region 21Q and a lower layer side in the peripheral region 22Q, the different patterns are stacked; therefore, there is a height difference between the cell region 21Q and the peripheral region 22Q. Although the cell region 21Q is lower than the peripheral region 22Q in FIG. 4, the cell region 21Q may be higher than the peripheral region 22Q.

In this manner, the space patterns 250A to 250C are different from each other in pattern density and height; therefore, by varying the focus values and the aberration correction values, the dimension widths Da to Dc of the space patterns 250A to 250C exhibit the different amounts of variation.

Figure 5:
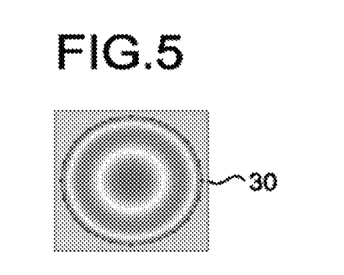
FIG. 5 is a diagram for describing spherical aberration.

FIG. 5 is a diagram for describing the spherical aberration. In the case of exposing the product substrate by the exposure device 10, the spherical aberration (aberration distribution: 30) expressed by using the $Z_9$ component of Zernike polynomials occurs. Therefore, the exposure device 10 exposes the product substrate using a spherical aberration correction value for correcting the spherical aberration. In this case, the exposure device 10 according to the embodiment calculates the spherical aberration correction value at which the difference in best focus value between the patterns is the minimum, and exposes the product substrate by using the calculated spherical aberration correction value.

Figure 6:
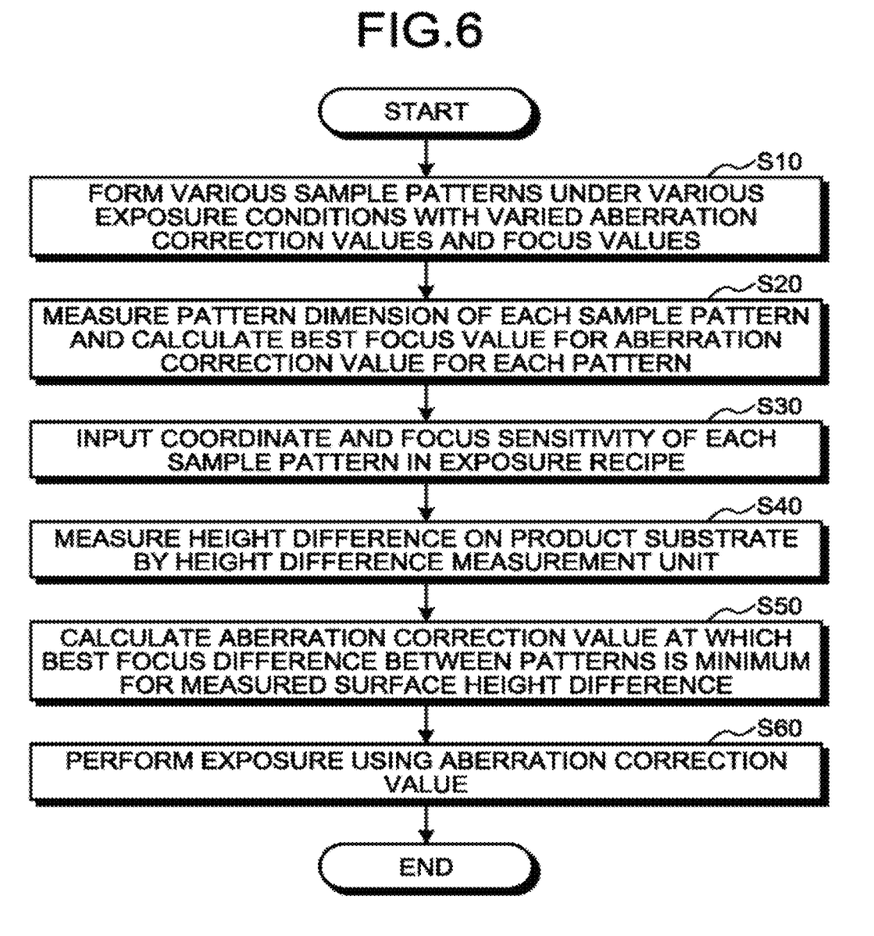
FIG. 6 is a flowchart of a procedure of an exposure process according to the embodiment.

Next, the procedure of the exposure process using the exposure device 10 is described. FIG. 6 is a flowchart of the procedure of the exposure process according to the embodiment. Before the product substrate is exposed, the focus sensitivity information 121 is formed using the sample substrate.

When the focus sensitivity information 121 is formed, a resist is applied to the sample substrate. Then, the pattern is formed on the sample substrate by exposure of the exposure device 10 using the same mask as that used in the processing of the product under various exposure conditions in which the aberration correction value and the focus value are varied. After that, the sample substrate is developed. Thus, the same pattern as that in the processing of the product (sample pattern) is formed on the sample substrate under various conditions (step S10).

After that, the pattern dimension of each sample pattern is measured. Based on the correlation among the varied aberration correction value, the varied focus value, and the pattern dimension of the sample pattern, the focus sensitivity (the best focus for the aberration correction value) is calculated for every sample pattern (step S20). Then, the focus sensitivity information 121 in which the coordinate of the sample pattern and the focus sensitivity are correlated with each other is formed.

Here, a method of calculating the focus sensitivity is described. In the method of calculating the focus sensitivity described here, the focus on the cell part 25A is 0 (reference).

Figure 7A:
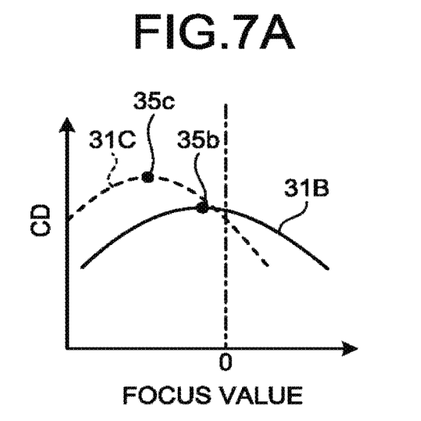
FIG. 7A is a diagram representing a relation between a pattern dimension and a focus value in a case where a negative aberration correction value is set.
Figure 7B:
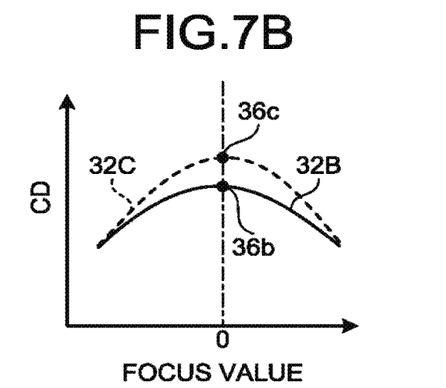
FIG. 7B is a diagram representing a relation between a pattern dimension and a focus value in a case where an aberration correction value is not set.
Figure 7C:
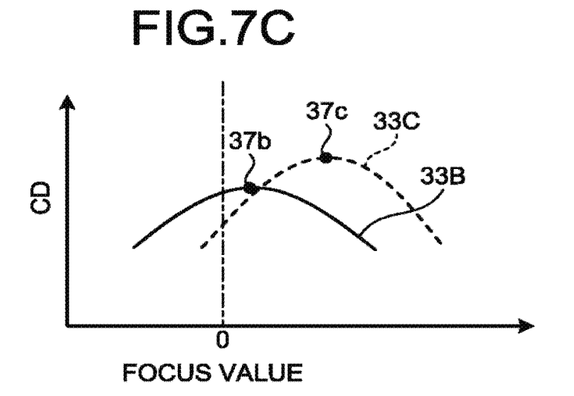
FIG. 7C is a diagram representing a relation between a pattern dimension and a focus value in a case where a positive aberration correction value is set.

FIG. 7A is a diagram representing a relation between the pattern dimension and the focus value in a case where a negative aberration correction value is set. FIG. 7B is a diagram representing a relation between the pattern dimension and the focus value in a case where the aberration correction value is not set. FIG. 7C is a diagram representing a relation between the pattern dimension and the focus value in a case where a positive aberration correction value is set.

Here, description is made of the focus sensitivity of the space pattern 250B in the border part 25B and the focus sensitivity of the space pattern 250C in the peripheral part 25C. In FIG. 7A to FIG. 7C, the horizontal axis represents the focus value and the vertical axis represents the pattern dimension (CD) of the space patterns 250B and 250C. Dimension characteristics 31B, 32B, and 33B are the dimension characteristics of the space pattern 250B, and dimension characteristics 31C, 32C, and 33C are the dimension characteristics of the space pattern 250C.

As indicated by the dimension characteristics 31B, 31C, 32B, 32C, 33B, and 33C in FIG. 7A to FIG. 7C, the focus value at which the dimension is the maximum is the best focus. In other words, the focus value corresponding to an apex of each dimension characteristic is the best focus.

As illustrated in FIG. 7A, in a case where the negative aberration correction value is set, the best focus for the space pattern 250B (an apex 35b of the dimension characteristic 31B) is shifted a little to a negative side from a focus value=0. In a case where the negative aberration correction value is set, the best focus for the space pattern 250C (an apex 35c of the dimension characteristic 31C) is shifted largely to a negative side as compared to the best focus for the space pattern 250B. Here, since the focus for the space pattern 250A is used as the reference, the best focus for the space pattern 250A is not shifted even if the negative aberration correction value is set.

As illustrated in FIG. 7B, if an aberration correction value of 0 is set, the best focuses for the space patterns 250B and 250C (an apex 36b of the dimension characteristic 32B and an apex 36c of the dimension characteristic 32C) are not shifted from a focus value of 0 and remains 0. Since the focus for the space pattern 250A is used as the reference here, if an aberration correction value of 0 is set, the best focus for the space pattern 250A is not shifted.

As illustrated in FIG. 7C, if the positive aberration correction value is set, the best focus for the space pattern 250B (an apex 37b of the dimension characteristic 33B) is shifted a little to a positive side from a focus value=0. In a case where the positive aberration correction value is set, the best focus for the space pattern 250C (an apex 37c of the dimension characteristic 33C) is shifted largely to a positive side as compared to the best focus for the space pattern 250B. Here, since the focus for the space pattern 250A is used as the reference, the best focus for the space pattern 250A is not shifted even if the positive aberration correction value is set.

In this manner, the space pattern 250B of the border part 252 exhibits the dimension characteristic 31P, the dimension characteristic 32B, and the dimension characteristic 33B relative to the negative aberration correction value, an aberration correction value of 0, and the positive aberration correction value. In other words, in the space pattern 250B of the border part 25B, the best focus varies depending on the aberration correction value.

Furthermore, the space pattern 250C of the peripheral part 25C exhibits the dimension characteristic 31C, the dimension characteristic 32C, and the dimension characteristic 33C relative to the negative aberration correction value, an aberration correction value of 0, and the positive aberration correction value. In other words, in the space pattern 250C of the peripheral part 25C, the best focus varies depending on the aberration correction value more largely than the best focus in the space pattern 250B. In addition, in the space pattern 250A of the cell part 25A, the best focus does not vary even though the aberration correction value is varied.

In this manner, how the correlation between the aberration correction value and the best focus varies (focus sensitivity) is different depending on the pattern. Since the patterns are different in pattern density and pattern height, how the correlation between the aberration correction value and the best focus varies is different depending on the difference in pattern density and pattern height. In other words, when the pattern density and the pattern height are different, the focus sensitivity is different.

The focus sensitivity information 121 that is formed is input to an exposure recipe stored in the exposure device 10. In other words, in the exposure recipe, the focus sensitivity information 121 (coordinate and focus sensitivity of each sample pattern) is input (step S30). This causes the storage unit 12 to store the focus sensitivity information 121. The exposure recipe is the information used when the exposure device 10 exposes the product substrate. The exposure recipe includes the focus value, the exposure amount, and the focus sensitivity information 121.

After the focus sensitivity information 121 is stored in the exposure device 10, the product substrate is carried into the exposure device 10. Then, the height difference measurement unit 13 measures the height difference of the product substrate (height of surface) (step S40). The height difference measurement unit 13 transmits the measured height difference to the storage unit 12 as the height difference information 122. This causes the storage unit 12 to store the height difference information 122.

The correction value calculation unit 16 reads out the focus sensitivity information 121 and the height difference information 122 from the storage unit 12. Then, based on the read focus sensitivity information 121 and height difference information 122, the correction value calculation unit 16 calculates the aberration correction value at which the best focuses for the pattern group formed on the product substrate satisfy a first condition. The aberration correction value that satisfies the first condition is the aberration correction value at which the difference between the maximum value and the minimum value of the best focuses for the pattern group is the minimum, for example. In this case, the correction value calculation unit 16 calculates the aberration correction value at which the difference in best focus for the pattern group on the product substrate is the minimum on the basis of the read focus sensitivity information 121 and height difference information 122 (step S50).

For example, the correction value calculation unit 16 extracts first to N-th (N is a natural number) focus sensitivities k1 to kn for first to N-th patterns on the product substrate from the focus sensitivity information 121. The correction value calculation unit 16 extracts first to N-th heights for the first to N-th patterns on the product substrate from the height difference information 122. Then, by using the formulae below, the aberration correction value at which the difference in best focus among the first to N-th patterns is the minimum is calculated. Note that BF1 to BFn represent the best focuses for the first to N-th patterns, S represents the aberration correction value, and Z1 to Zn represent the heights of the first to N-th patterns.

$$BF1 = k1 \times S \times Z1$$

$$BF2 = k2 \times S \times Z2$$

$$...$$

$$BFn = kn \times S \times Zn$$

Figure 8A:
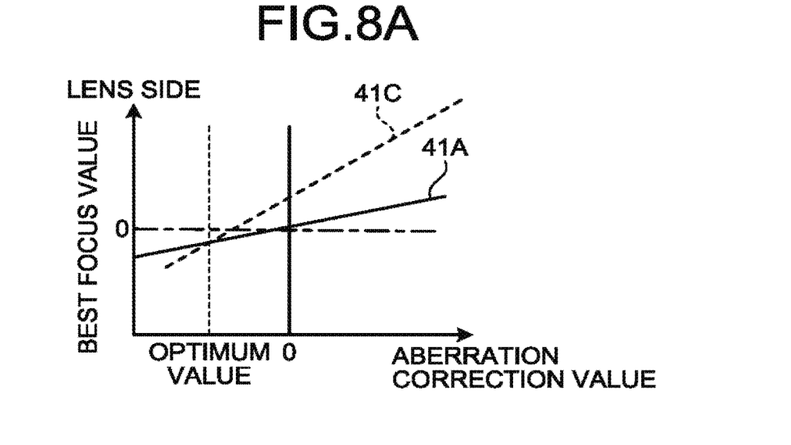
FIG. 8A is a diagram representing focus sensitivity when a peripheral region is lower than a cell region.
Figure 8B:
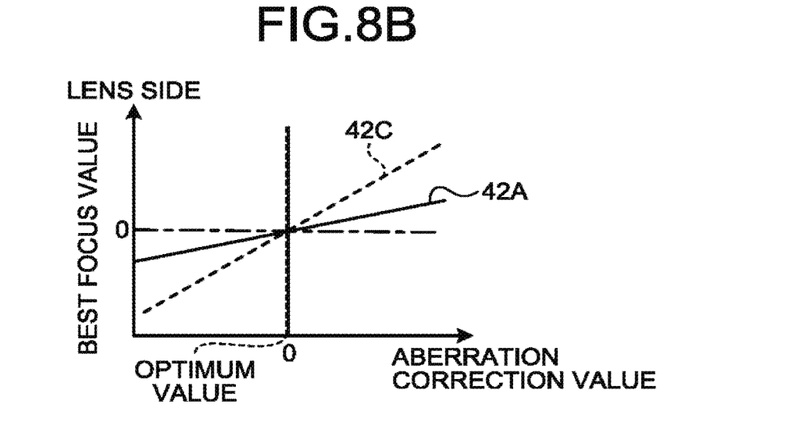
FIG. 8B is a diagram representing focus sensitivity when the cell region and the peripheral region have the same height.
Figure 8C:
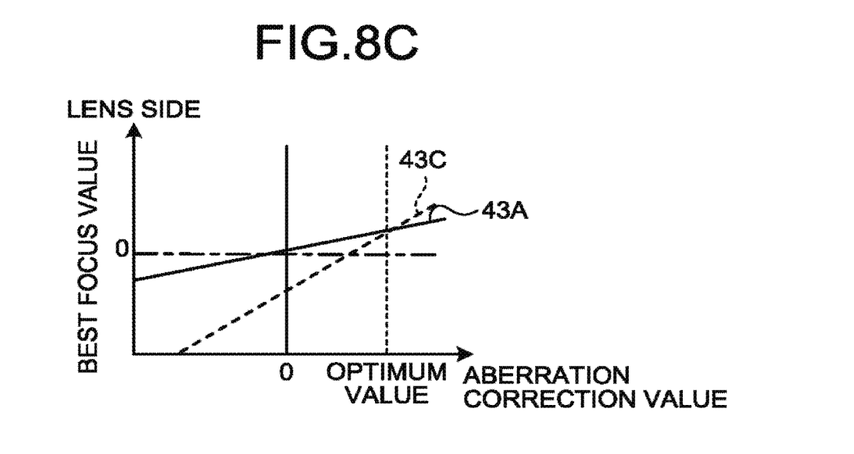
FIG. 8C is a diagram representing focus sensitivity when the peripheral region is higher than the cell region.

FIG. 8A is a diagram representing the focus sensitivity when the peripheral region is lower than the cell region. FIG. 8B is a diagram representing the focus sensitivity when the cell region and the peripheral region have the same height. FIG. 8C is a diagram representing the focus sensitivity when the peripheral region is higher than the cell region.

FIG. 8A to FIG. 8C represent the focus sensitivity corresponding to the correlation between the aberration correction value and the best focus value. In each of FIG. 8A to FIG. 8C, the horizontal axis represents the aberration correction value and the vertical axis represents the best focus value. A positive direction of the vertical axis corresponds to a direction of a lens where a focal point of the exposure light is adjusted (lens side). The inclination of focus characteristics 41A, 42A, and 43A (best focus/aberration correction value) corresponds to the focus sensitivity of the space pattern 250A, and the inclination of focus characteristics 41C, 42C, and 43C (best focus/aberration correction value) corresponds to the focus sensitivity of the space pattern 250C.

The focus sensitivity of the space pattern 250A is constant regardless of the heights of the cell regions 21P and 21Q and the peripheral regions 22P and 22Q. In other words, the focus sensitivity of the space pattern 250A is the same in each of the focus characteristics 41A, 42A, and 43A. Here, since the focus for the space pattern 250A is used as the reference, the best focus value for the cell regions 21P and 21Q is 0 when the aberration correction value is 0 regardless of the height difference between the cell regions 21P and 21Q and the peripheral regions 22P and 22Q.

The focus sensitivity of the space pattern 250C is constant regardless of the heights of the cell regions 21P and 21Q and the peripheral regions 22P and 22Q. In other words, the focus sensitivity of the space pattern 250C is the same in each of the focus characteristics 41C, 42C, and 43C.

When the peripheral regions 22P and 22Q are lower than the cell regions 21P and 21Q as illustrated in FIG. 8A, in the focus characteristic 41C in the peripheral regions 22P and 22Q, the best focus is shifted to the negative side as compared to when the peripheral regions 22P and 22Q and the cell regions 21P and 21Q have the same height. Then, the aberration correction value at which the difference between the focus characteristics 41A and 41C is the minimum is the optimum aberration correction value (optimum value).

When the cell regions 21P and 21Q and the peripheral regions 22P and 22Q have the same height as illustrated in FIG. 8B, in the focus characteristics 42A and 42C, the best focus does not shift. Therefore, the aberration correction value that makes the focus value=0 is the optimum aberration correction value.

When the peripheral regions 22P and 22Q are higher than the cell regions 21P and 21Q as illustrated in FIG. 8C, in the focus characteristic 43C in the peripheral regions 22P and 22Q, the best focus is shifted to the positive side as compared to when the cell regions 21P and 21Q and the peripheral regions 22P and 22Q have the same height. Then, the aberration correction value at which the difference between the focus characteristics 43A and 43C is the minimum is the optimum aberration correction value. Here, description is made of the case in which the aberration correction value optimum to the two focus characteristics is calculated; however, in the case of calculating the aberration correction value optimum to three or more focus characteristics, the correction value calculation unit 16 calculates the aberration correction value at which the difference in best focus between the patterns (the difference between the maximum value and the minimum value) is the minimum.

In this manner, the optimum value of the aberration correction value varies depending on the height difference between the cell regions 21P and 21Q and the peripheral regions 22P and 22Q. The exposure unit 15 of the exposure device 10 exposes the product substrate by using the aberration correction value calculated by the correction value calculation unit 16 (step S60). The exposure device 10 performs the process of steps S40 to S60 for each product substrate. In other words, the exposure device 10 exposes the product substrate by measuring the height difference, calculating the aberration correction value, and correcting the aberration with the aberration correction value for each product substrate.

In this manner, the exposure device 10 calculates the aberration correction value appropriate for the difference in best focus between the patterns on the basis of the height difference for each product substrate, and performs exposure while correcting the aberration at the exposure.

In the present embodiment, the exposure device 10 includes the height difference measurement unit 13; however, the height difference measurement unit 13 may be disposed outside the exposure device 10. In the present embodiment, the height difference is measured for each substrate and the aberration correction value is calculated for each substrate; however, the height difference may be measured for each exposure shot and the aberration correction value may be calculated for each exposure shot.

When a semiconductor device (semiconductor integrated circuit) is manufactured on the product substrate, a process of calculating the aberration correction value and a process of performing the exposure with the use of the calculated aberration correction value are performed for each layer of a wafer process, for example. Specifically, after a process film is formed on the product substrate, a resist is applied on the process film. After that, the exposure device 10 measures the height difference of the product substrate, and calculates the aberration correction value for the product substrate. In addition, the exposure device 10 exposes the product substrate with the use of the calculated aberration correction value. After that, by developing the product substrate, the resist pattern is formed on the product substrate. The aforementioned process of measuring the height difference, process of calculating the aberration correction value, and process of performing exposure are performed for each product substrate. On each product substrate, the process film is etched by using the resist pattern as a mask. This enables the actual pattern corresponding to the resist pattern to be formed on each product substrate. When the semiconductor device is manufactured, the formation process, the exposure process, the development process, the etching process, and the like for the process film are repeated for each layer. Note that the aberration correction value is calculated for each layer of the product substrate.

Figure 9:
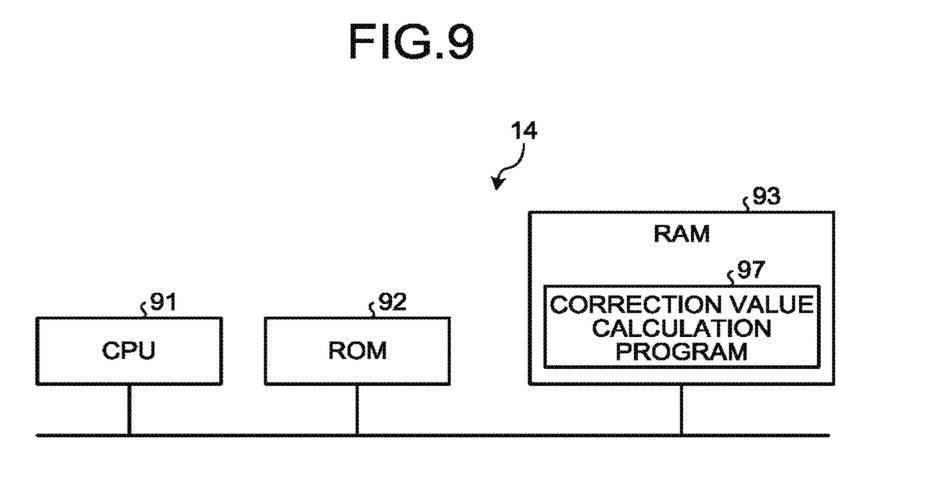
FIG. 9 is a diagram illustrating a hardware structure of a control unit according to the embodiment.

Next, description is made of a hardware structure of the control unit 14. FIG. 9 is a diagram illustrating a hardware structure of the control unit according to the embodiment. The control unit 14 includes a central processing unit (CPU) 91, a read only memory (ROM) 92, and a random access memory (RAM) 93. In the control unit 14, these CPU 91, ROM 92, and RAM 93 are connected through a bus line.

The CPU 91 calculates the aberration correction value by using a correction value calculation program 97 corresponding to a computer program. The correction value calculation program 97 is a computer program product that can be executed in a computer and that includes a nontransitory computer readable recording medium including a plurality of instructions to calculate the aberration correction value. The instructions of the correction value calculation program 97 cause a computer to execute the process of calculating the aberration correction value.

The correction value calculation program 97 is stored in the ROM 92 and is loaded in the RAM 93 through the bus line. FIG. 9 illustrates a state in which the correction value calculation program 97 is loaded in the RAM 93.

The CPU 91 executes the correction value calculation program 97 loaded in the RAM 93. Specifically, in the control unit 14, the CPU 91 reads out the correction value calculation program 97 from the ROM 92 and develops the correction value calculation program 97 in a program storage region in the RAM 93, and then performs various processes in accordance with the instruction input from the user. The CPU 91 temporarily stores various data generated in these various processes in the data storage region formed in the RAM 93.

The correction value calculation program 97 executed in the control unit 14 has a module structure including the correction value calculation unit 16, and these are loaded on a main storage device and generated on the main storage device.

In this manner, in the present embodiment, the exposure device 10 calculates the aberration correction value at which the difference in best focus for the pattern group formed on the product substrate by exposure is the minimum on the basis of the focus sensitivity information 121 expressing the relation between the aberration correction value and the best focus, and the height difference information 122 expressing the height difference of the product substrate. Then, by using the aberration correction value at which the difference in best focus is the minimum, the exposure device 10 exposes the product substrate. Since this can minimize the difference in focus between the patterns, the amount of defocus due to the height difference between the patterns for the product substrate with various pattern densities can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure method comprising:
    inputting focus sensitivity information in which focus sensitivity expressing a relation between an aberration correction value set in an exposure device and a best focus when a pattern is formed on a first substrate by exposure of the exposure device using the aberration correction value, and the pattern are correlated;
    measuring a surface height difference of a second substrate;
    calculating the aberration correction value in which best focuses for a pattern group to be formed on the second substrate by exposure satisfy a first condition on the basis of the focus sensitivity information and the surface height difference; and
    exposing the second substrate by the exposure device using the aberration correction value satisfying the first condition.

2. The exposure method according to claim 1, wherein the aberration correction value satisfying the first condition is an aberration correction value at which a difference between a maximum value and a minimum value of the best focuses for the pattern group is the minimum.

3. The exposure method according to claim 1, further comprising:
    forming the pattern on the first substrate in a manner that the first substrate is exposed by the exposure device using a mask provided with the same mask pattern as a mask used when the exposure device exposes the second substrate and varying the aberration correction value and a focus value;
    measuring a pattern dimension of the pattern; and
    calculating the focus sensitivity on the basis of the pattern dimension, the aberration correction value that is varied, and the focus value that is varied.

4. The exposure method according to claim 1, wherein the aberration correction value is a correction value for correcting spherical aberration, astigmatism, or coma aberration.

5. The exposure method according to claim 1, wherein:
    in the calculation, the aberration correction value satisfying the first condition is calculated for each substrate; and
    in the exposure, the second substrate is exposed using the aberration correction value satisfying the first condition for each substrate.

6. The exposure method according to claim 1, wherein:
    in the calculation, the aberration correction value satisfying the first condition is calculated for each exposure shot on the second substrate; and
    in the exposure, the second substrate is exposed using the aberration correction value satisfying the first condition for each exposure shot on the second substrate.

7. The exposure method according to claim 1, wherein:
    the pattern group includes a first pattern with a first height and a first pattern density, and a second pattern with a second height and a second pattern density; and
    in the calculation, the aberration correction value in which the best focuses for the first pattern and the second pattern satisfy the first condition is calculated.

8. The exposure method according to claim 7, wherein:
    the first pattern is a pattern formed by exposure in a memory cell region; and
    the second pattern is a pattern formed by exposure in a peripheral region disposed around the memory cell region.

* * * * *